(12) United States Patent
Wang et al.

(10) Patent No.: US 10,541,195 B2
(45) Date of Patent: Jan. 21, 2020

(54) PACKAGE STRUCTURE OF CAPACITIVE COUPLING ISOLATOR

(71) Applicant: LITE-ON SINGAPORE PTE. LTD., Midview (SG)

(72) Inventors: You-Fa Wang, Singapore (SG); Wei-Wen Lai, Kaohsiung (TW); Pu-Han Lin, New Taipei (TW); Yuan-Lung Wu, New Taipei (TW)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 16/165,763

(22) Filed: Oct. 19, 2018

(65) Prior Publication Data

US 2019/0237394 A1    Aug. 1, 2019

(30) Foreign Application Priority Data

Jan. 29, 2018    (CN) .......................... 2018 1 0084327

(51) Int. Cl.
| | |
|---|---|
| *H01L 23/495* | (2006.01) |
| *H04B 5/00* | (2006.01) |
| *H02M 3/07* | (2006.01) |
| *H02M 3/06* | (2006.01) |
| *G08C 17/06* | (2006.01) |

(Continued)

(52) U.S. Cl.
CPC .. *H01L 23/49537* (2013.01); *H01L 23/49541* (2013.01); *H01L 23/49589* (2013.01); *G08C 17/06* (2013.01); *H01L 23/49534* (2013.01); *H01L 23/49575* (2013.01); *H01L 23/66* (2013.01); *H02M 3/06* (2013.01); *H02M 3/07* (2013.01); *H04B 5/005* (2013.01); *H04B 5/0031* (2013.01); *H04L 25/0266* (2013.01)

(58) Field of Classification Search
CPC ......... H01L 23/49537; H01L 23/49541; H01L 23/49589; H02M 3/06; H02M 3/07; G08C 17/06; H04B 5/0031; H04B 5/005; H04L 25/0266
See application file for complete search history.

(56) References Cited

U.S. PATENT DOCUMENTS 4,454,529 A * 6/1984 Philofsky ................. H01G 4/40
  257/665
5,629,838 A * 5/1997 Knight ............... G01R 31/3025
  361/782

(Continued)

*Primary Examiner* — Victoria K. Hall
(74) *Attorney, Agent, or Firm* — Li & Cai Intellectual Property (USA) Office

(57) ABSTRACT

A package structure for a capacitive coupling isolator is provided. The package structure includes a first and a second leadframes, a transmitter, a receiver and a packaging body. The first leadframe includes a first and a second signal input pins and a first electrode plate, and the second leadframe includes a first and a second signal output pins and a second electrode plate. The first and second electrode plates are arranged one above another and aligned with each other for forming a plurality of capacitors. The transmitter is disposed on the first leadframe and the receiver is disposed on the second leadframe. The packaging body encloses the first and second leadframes and is filled therebetween for electrically isolating the first and second leadframes from each other.

10 Claims, 7 Drawing Sheets

(51) Int. Cl.
*H01L 23/66* (2006.01)
*H04L 25/02* (2006.01)

(56) References Cited

U.S. PATENT DOCUMENTS

| | | | | |
|---|---|---|---|---|
| 7,919,781 | B2* | 4/2011 | Wang | H01L 25/167 257/666 |
| 9,258,032 | B2* | 2/2016 | Barrenscheen | G08C 17/06 |
| 9,960,671 | B2* | 5/2018 | Ho | H01L 23/48 |
| 10,097,338 | B1* | 10/2018 | Ng | G05F 1/561 |
| 10,439,065 | B2* | 10/2019 | Tellkamp | H01L 23/495 |
| 10,446,498 | B2* | 10/2019 | Constantino | H01L 23/49537 |
| 2004/0032015 | A1* | 2/2004 | Sekiguchi | H01L 23/49589 257/684 |
| 2010/0259909 | A1* | 10/2010 | Ho | H01F 19/08 361/767 |
| 2010/0328902 | A1* | 12/2010 | Ho | H01L 23/495 361/748 |
| 2011/0049693 | A1* | 3/2011 | Nakashiba | H01L 23/48 257/676 |
| 2011/0189952 | A1* | 8/2011 | Barrenscheen | G08C 17/06 455/41.1 |
| 2013/0313446 | A1* | 11/2013 | Yamazaki | H04B 10/802 250/551 |
| 2014/0162552 | A1* | 6/2014 | Barrenscheen | G08C 17/06 455/41.1 |
| 2015/0004902 | A1* | 1/2015 | Pigott | H01L 28/10 455/41.1 |
| 2015/0130022 | A1* | 5/2015 | Watanabe | H01L 28/10 257/531 |
| 2015/0280785 | A1* | 10/2015 | Brauchler | H04B 5/0018 257/531 |
| 2016/0072167 | A1* | 3/2016 | Kawai | H01L 23/49822 333/24 R |
| 2016/0093570 | A1* | 3/2016 | Watanabe | H01L 25/162 257/531 |
| 2016/0190918 | A1* | 6/2016 | Ho | H01L 23/48 327/530 |
| 2018/0277518 | A1* | 9/2018 | Iida | H01L 21/0214 |
| 2019/0027436 | A1* | 1/2019 | Lum | H01L 23/5225 |
| 2019/0035707 | A1* | 1/2019 | Ikeda | H01L 21/4814 |
| 2019/0182179 | A1* | 6/2019 | Pak | H04B 5/0031 |

* cited by examiner

PACKAGE STRUCTURE OF CAPACITIVE COUPLING ISOLATOR

CROSS-REFERENCE TO RELATED PATENT APPLICATION

This application claims the benefit of priority to China Patent Application No. 201810084327.X, filed on Jan. 29, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND

1. Technical Field

The instant disclosure relates to a package structure of a capacitive coupling isolator, and in particular, to an on-package package structure formed by supporting frames and packaging materials.

2. Description of Related Art

In the existing art, electric field coupling or capacitive coupling techniques are used for forming semiconductor isolator. Among the types of the capacitive coupling isolators, on-chip capacitors are the mainstream product on the market. Since the on-chip capacitors are manufactured by a semiconductor high-pressure capacitor process, the isolator has to meet a specific insulating voltage requirement. Therefore, in the manufacturing process of the on-chip capacitor, a chip manufacturing process which is more expensive than a traditional CMOS manufacturing process is required. In addition, the size of the product is relatively large. Besides, the isolating voltage of the on-chip capacitor is limited by the thickness of the main material (such as silicon dioxide) of the chip and cannot achieve the requirement of specific application such as medical equipment.

Therefore, there is a need to provide a capacitive coupling package structure having the advantages of having simple manufacturing process, low cost, smaller product size and good isolating voltage.

SUMMARY

The main object of the instant disclosure is to provide a capacitive coupling package structure for solving the problems in the existing art. The capacitive coupling package structure provided by the instant disclosure includes an on-package capacitor (also referred to as a built-in capacitor) formed by a leadframe and a package material. The package structure can be manufactured by a relatively simple manufacturing process with lower cost.

In order to achieve the above object, an embodiment of the instant disclosure provides a package structure for a capacitive coupling isolator comprising a first leadframe, a second leadframe, a transmitter, a receiver and a packaging body. The first leadframe includes a first signal input pin, a second signal input pin and a first electrode plate. The second leadframe includes first signal output pin, a second signal output pin and a second electrode plate. The transmitter is disposed on the first leadframe and electrically connected to the first signal input pin, the second signal input pin and the first electrode plate. The receiver is disposed on the second leadframe and electrically connected to the first signal output pin, the second signal output pin and the second electrode plate. The package body encloses the first leadframe and the second leadframe. The package body is filled between the first leadframe and the second leadframe for electrically isolating the first leadframe and the second leadframe from each other. The first electrode plate includes a first signal input positive plate, a first signal input negative plate, a second signal input positive plate and a second signal input negative plate separated from each other, and the second electrode plate includes a first signal output positive plate, a first signal output negative plate, a second signal output positive plate and a second signal output negative plate. The first electrode plate and the second electrode plate are arranged one above each other and aligned with each other for forming a plurality of capacitors.

Preferably, the first leadframe further includes a first direct current pin and a first grounding pin both electrically connected to the transmitter, and the second leadframe further includes a second direct current pin and a second grounding pin connected to the receiver.

Preferably, the transmitter and the receiver are both operated in differential modes.

Preferably, the first signal input pin, the second signal input pin and the first electrode plate are disposed on a same side of the transmitter, and the first signal output pin, the second signal output pin and the second electrode plate are disposed on a same side of the receiver.

Preferably, any two of the first signal input pin, the second signal input pin and the first electrode plate are respectively disposed on two different sides of the transmitter, and any two of the first signal output pin, the second signal output pin and the second electrode plate are disposed on two different sides of the receiver.

Preferably, a polyimide film is disposed between the first leadframe and the second leadframe, and the package body is filled between the first leadframe, the second leadframe and the polyimide film.

Preferably, the first signal input positive plate and the first signal output positive plate are aligned with each other for forming a first positive physical link, and the first signal input negative plate and the first signal output negative plate are aligned with each other for forming a first negative physical link, wherein the second signal input positive plate and the second signal output positive plate are aligned with each other for forming a second positive physical link, and the second signal input negative plate and the second signal output negative plate are aligned with each other for forming a second negative physical link, the first positive physical link and the first negative physical link together form a first communication channel, and the second positive physical link and the second negative physical link together form a second communication channel.

Preferably, the transmitter and the receiver are respectively disposed on two surfaces opposite to each other and each belonging to the first leadframe and the second leadframe.

Preferably, the transmitter and the receiver are respectively disposed on two surfaces facing each other and each belonging to the first leadframe and the second leadframe.

Preferably, the transmitter and the receiver are respectively disposed on two surfaces facing a same direction and each belonging to the first leadframe and the second leadframe.

One of the advantages of the instant disclosure is that based on the technical features of "a package body enclosing the first leadframe and the second leadframe, the package body being filled between the first leadframe and the second leadframe for electrically isolating the first leadframe and the second leadframe from each other" and "the first electrode plate and the second electrode plate are arranged one above each other and aligned with each other for forming a plurality of capacitors", the package structure including capacitors can be manufactured by the leadframes under a simple process, and the isolating voltage of the product can be adjusted by the distance between the first leadframe and the second leadframe and the material of the packaging body.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
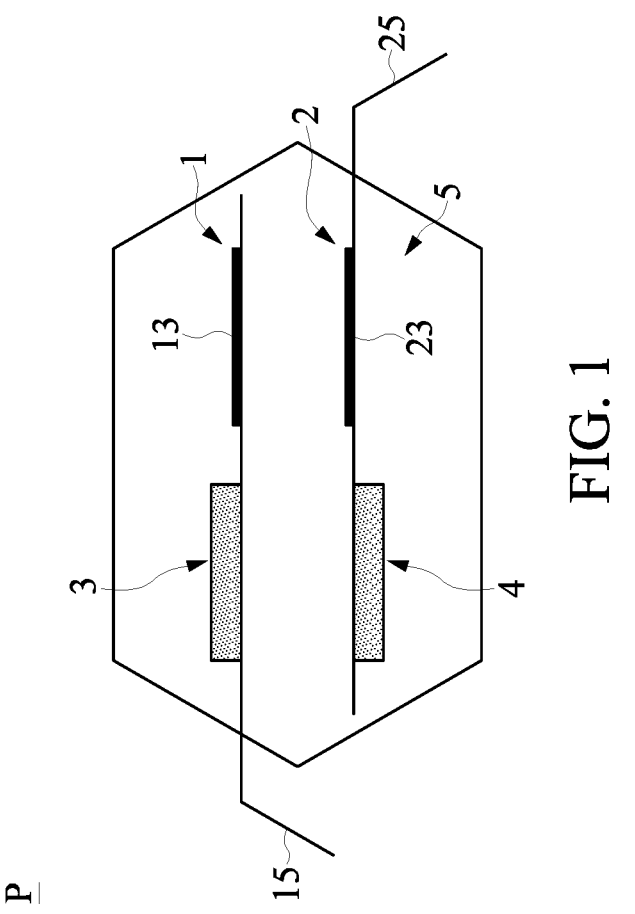
FIG. 1 is a schematic view of the capacitive coupling package structure provided by the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 2:
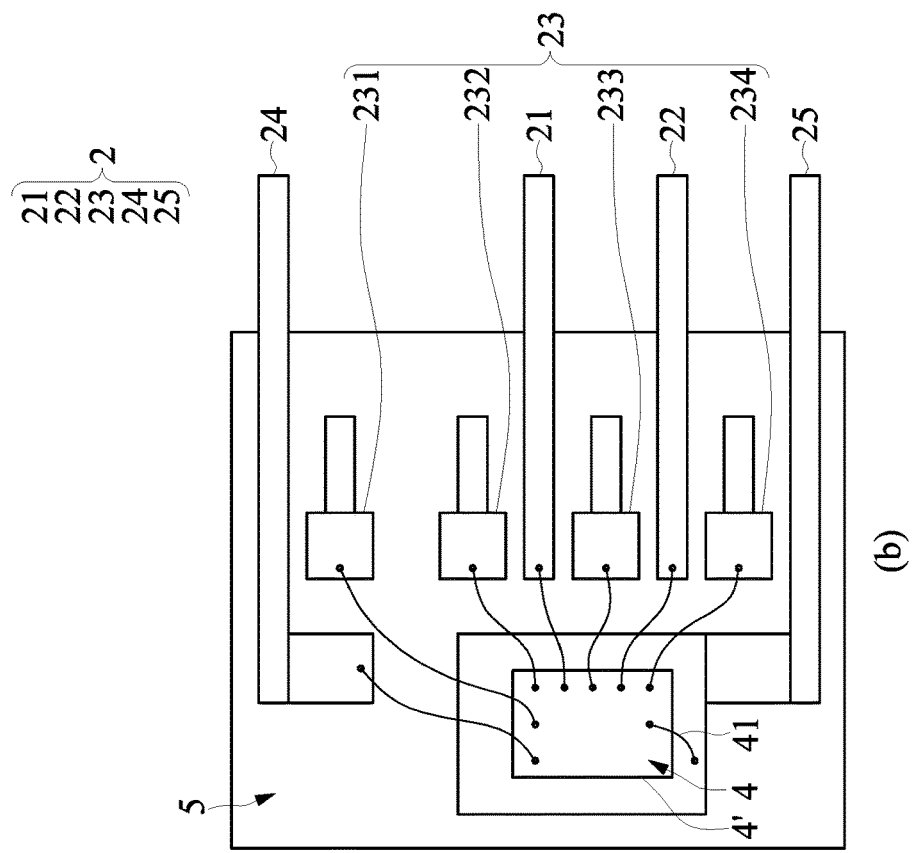
FIG. 2 is a partial schematic view of the capacitive coupling package structure provided by the instant disclosure.
Figure 2:
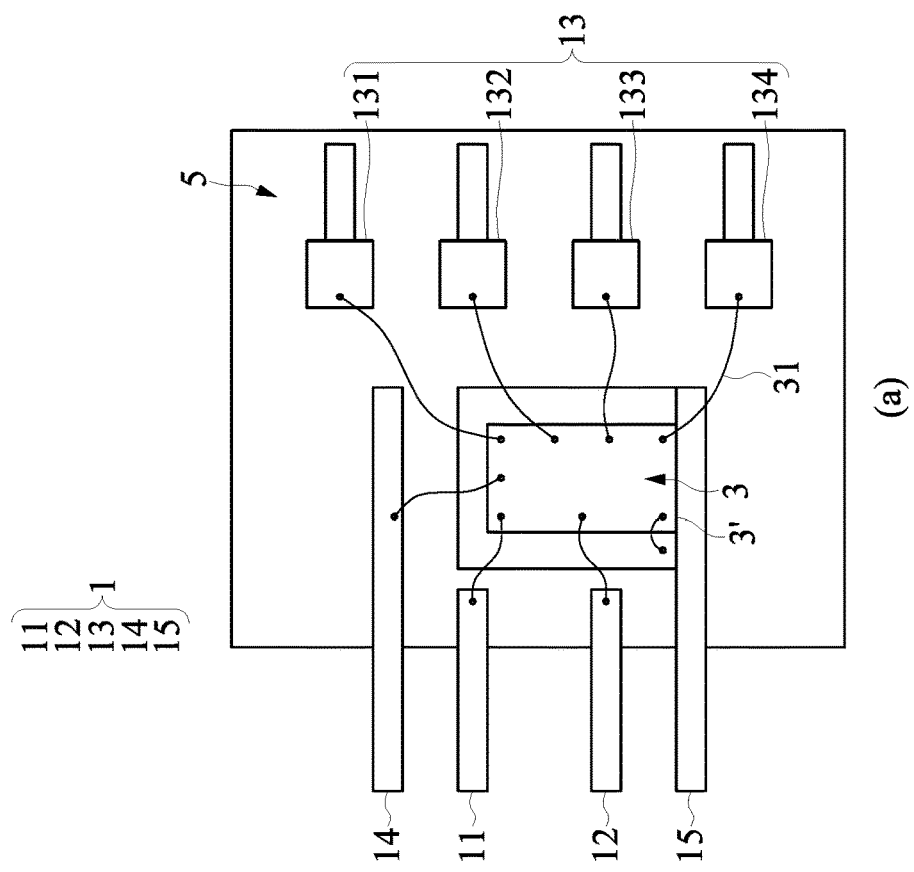
Figure 3:
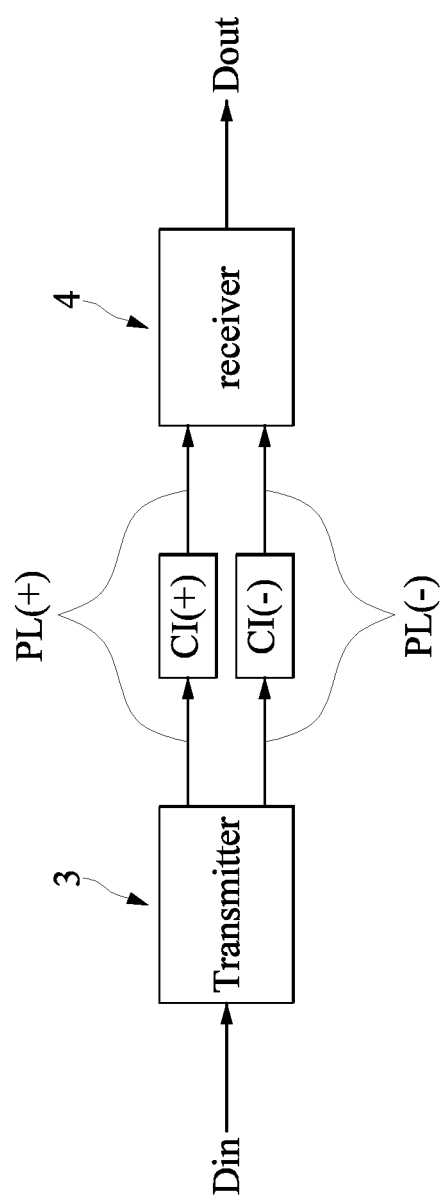
FIG. 3 is a block diagram showing the signal transmission in the capacitive coupling package structure provided by the instant disclosure.

Reference is made to FIG. 1 to FIG. 3. FIG. 1 is a schematic view of the capacitive coupling package structure provided by the instant disclosure, FIG. 2 is a partial schematic view of the capacitive coupling package structure provided by the instant disclosure, and FIG. 3 is a block diagram showing the signal transmission in the capacitive coupling package structure provided by the instant disclosure. It should be noted that FIG. 1 and FIG. 2 are only schematic views which are not illustrated according to actual dimensions of the capacitor coupling package structure P.

As shown in FIG. 1, the capacitor coupling package structure P provided by the instant disclosure includes a first leadframe 1, a second leadframe 2, a transmitter 3, a receiver 4 and a packaging body 5. The first leadframe 1 and the second leadframe 2 correspond to each other, are aligned with each other and are separated from each other. Specifically, the first leadframe 1 and the second leadframe 2 can be two metal frames with a same size, and the first leadframe 1 can be disposed at a location above the second leadframe 2 and in alignment with the second leadframe 2. In the embodiment shown in FIG. 1, the first leadframe 1 is disposed right above the second leadframe 2. However, the size of the first leadframe 1 and the second leadframe 2 is not limited in the instant disclosure.

The transmitter 3 and the receiver 4 are respectively disposed on the first leadframe 1 and the second leadframe 2. The transmitter 3 and the receiver 4 can be respectively fixed on a portion of the first leadframe 1 and a portion of the second leadframe 2 by die-attach processes. In the instant disclosure, the transmitter 3 and the receiver 4 can be chips respectively having the functions of transmitting and receiving signals. The transmitter 3 and the receiver 4 are galvanically isolated (DC isolated) though the capacitor formed by the first electrode plate 13 and the second electrode plate 23, while a high frequency voltage can pass through the barrier formed by the capacitor by AC coupling.

The packaging body 5 encloses the first leadframe 1 and the second leadframe 2 and is filled between the first leadframe 1 and the second leadframe 2 for electrically isolating the first leadframe 1 and the second leadframe 2 from each other. Specifically, the packaging body 5 can be formed by an insulating material such as an epoxy resin or a silicone resin. In the instant disclosure, the insulating material of the packaging body 5 can be selected according to the requirements of the product. For example, different insulating materials having different insulating properties can be selected based on the insulating voltage or the isolating voltage of the product.

For example, in the capacitor coupling package structure P provided by the instant disclosure, a polyimide film can be further included, and the packaging body 5 can be filled between the first leadframe 1, the second leadframe 2 and the polyimide film. The use of the polyimide film can increase the electrical isolating efficiency between the first leadframe 1 and the second leadframe 2, thereby significantly increasing the galvanically isolated effect and the isolating voltage. Therefore, the isolating efficiency of the capacitor coupling package structure P can be increased while having a relatively small size.

In addition, the distance between the first leadframe 1 and the second leadframe 2 in the packaging body 5 critically affects the properties of the capacitor coupling package structure P manufactured therefrom. For example, by adjusting the spacing between the first leadframe 1 and the second leadframe 2, the distance between the first electrode plate 13 and the second electrode plate 23 respectively disposed on the first leadframe 1 and the second leadframe 2 can be adjusted, thereby changing the capacitance of the capacitors formed by the first capacitor component (including the first electrode plate 13) and the second capacitor component (including the second electrode plate 23). Therefore, the insulating voltage and the isolating voltage of the capacitive coupling package structure can be adjusted.

Next, reference is made to FIG. 1 and FIG. 2. FIG. 2(a) and FIG. 2(b) are the top schematic views of the first leadframe 1 and the second leadframe 2 of the capacitor coupling package structure P provided by the instant disclosure respectively. Meanwhile, other components such as the transmitter 3, the receiver 4 and the packaging body 5 are depicted in the figures as well.

As shown in FIG. 2(a), the first leadframe 1 includes a first signal input pin 11, a second signal input pin 12 and a first electrode plate 13. The first electrode plate 13 includes a first signal input positive electrode plate 131, a first signal input negative electrode plate 132, a second signal input positive electrode plate 133 and a second signal input negative electrode plate 134 separated from each other. All of the components in the first leadframe 1 can be formed by a same conductive material and can be formed in one piece. For example, the first signal input positive electrode plate 131, the first signal input negative electrode plate 132, the second signal input positive electrode plate 133 and the second signal input negative electrode plate 134 included in the first electrode plate 13 can be metal electrode plates made from a same material.

In addition, as shown in FIG. 2(a), the first leadframe 1 further includes a first carrying portion 3' for carrying the transmitter 3. The first carrying portion 3' can be a supporting frame extending from one of the pins (such as the first grounding pin 15 shown in FIG. 1). In the instant disclosure, the transmitter 3 can be disposed on the first carrying portion 3' by a die attach process.

In FIG. 2(a) and FIG. 2(b), the size and the relative positions of the components are not illustrated according to actual dimensions. In other words, the dimensions and the positions of the components are only depicted for illustration purpose. The location of each of the components, especially the dimensions and relative positions of the first signal input positive electrode plate 131, the first signal input negative electrode plate 132, the second signal input positive electrode plate 133 and the second signal input negative electrode plate 134 of the first electrode plate 13 is described later.

The first leadframe 1 further includes a first direct current pin 14 and a first grounding pin 15 electrically connected to the transmitter 3 disposed on the first carrying portion 3'. In addition, the capacitor coupling package structure P provided by the instant disclosure further includes a plurality of first connecting lines 31 which establish the electrical connections between the first direct current pin 14, the first grounding pin 15, the first signal input pin 11, the second signal input pin 12 and the first electrode plate 13.

Specifically, the first direct current pin 14 can provide a driving voltage to the transmitter 3 through the first connecting lines 31. In addition, the first signal input pin 11 and the second signal input pin 12 each input a first signal and a second signal to the transmitter 3 by the first connecting lines 31.

In the instant disclosure, the transmitter 3 can be a high frequency transmitter chip which is operated in a differential mode. In the instant disclosure, performing signal processing in a differential mode can enable the capacitor coupling package structure P to meet the requirement of common mode rejection (CMR). Therefore, the signal input from the first signal input pin 11 to the transmitter 3 is transmitted to the first signal input positive electrode plate 131 and the first signal input negative electrode plate 132 in a differential transmission mode for generating two physical links with the second electrode plate 23 of the second leadframe 2. Similarly, the signal input from the second signal input pin 12 to the transmitter 3 is transmitted to the second signal input positive electrode plate 133 and the second signal input negative electrode plate 134 in a differential transmission mode for generating two physical links with the second electrode plate 23.

Reference is made to FIG. 2(b). The arrangement of the second leadframe 2 and the related components shown in FIG. 2(b) are similar to that of the first leadframe 1. As shown in FIG. 2(b), the second leadframe 2 includes a first signal output pin 21, a second signal output pin 22 and a second electrode plate 23. The second electrode plate 23 includes a first signal output positive electrode plate 231, a first signal output negative electrode plate 232, a second signal output positive electrode plate 233 and a second signal output negative electrode plate 234 separated from each other. Similar to the first leadframe 1, the components of the second leadframe 2 can be formed by a same conductive material.

The second leadframe 2 further includes a second carrying portion 4' for carrying the receiver 4, the second carrying portion 4' can be a supporting frame extended from one of the pins (such as the second grounding pin 25 shown in the figure) of the second leadframe 2. In the instant disclosure, the receiver 4 can be disposed on the second carrying portion 4' by die attach.

The second leadframe 2 further includes a second direct current pin 24 and a second grounding pin 25 electrically connected to the receiver 4 disposed on the second carrying portion 4'. In addition, the capacitor coupling package structure P provided by the instant disclosure further includes a plurality of second connecting lines 41. The plurality of second connecting lines 41 are used to establish the electrical connections between the second direct current pin 24, the second grounding pin 25, the first signal output pin 21, the second signal output pin 22 and the second electrode plate 23.

Specifically, the second direct current pin 24 can provide a driving voltage to the receiver 4 by the second connecting lines 41. In addition, the first signal output pin 21 and the second signal output pin 22 respectively receive a first signal and a second signal from the receiver 4 through the second connecting lines 41.

In the instant disclosure, the receiver 4 can be a high frequency receiver chip which is operated in a differential mode. Therefore, the receiver 4 receives the signal (including four physical links) from the second electrode plate 23, and transmits the first signal and the second signal to the first signal output pin 21 and the second signal output pin 22 respectively.

The signal transmissions between the first leadframe 1 and the second leadframe 2 are achieved by the first electrode plate 13 and the second electrode plate 23 which are corresponding and aligning to each other. In other words, based on the electrical field coupling effect between the first electrode plate 13 and the second electrode plate 23, the transmitter 3 and the receiver 4 can be electrically isolated from each other, and the high frequency signal can be transmitted through the first electrode plate 13 and the second electrode plate 23. In the embodiments of the instant disclosure, the first leadframe 1 can be disposed directly above the second leadframe 2, and the first electrode plate 13 is disposed directly above the second electrode plate 23. In other words, the first electrode plate 13 and the second electrode plate 23 are arranged one above another and aligned with each other. Therefore, the signal transmitted by the transmitter 3 in a differential mode to the first electrode plate 13 can be transmitted to the second electrode plate 23 by coupling effect. Therefore, the second electrode plate 23 can further transmit the received signal to the receiver 4, thereby completing the transmission of the signal.

In other words, the first electrode plate 13 and the second electrode plate 23 cooperate with each other for forming capacitors. Specifically, the first signal input positive electrode plate 131 and the first signal output positive electrode plate 231 are paired to form a capacitor, the first signal input negative electrode plate 132 and the first signal output negative electrode plate 232 are paired to form a capacitor, the second signal input positive electrode plate 133 and the second signal output positive electrode plate 233 are paired to form a capacitor, and the second signal input negative electrode plate 134 and the second signal output negative electrode plate 234 are paired to form a capacitor. Therefore, the capacitor coupling package structure P provided by the instant disclosure can include four on-package capacitors. These capacitors can be high voltage capacitors and have extremely small dimension, and can enable the capacitor coupling package structure P to have an adjustable isolating voltage.

Each of the capacitors formed by the first electrode plate 13 and the second electrode plate 23 has a physical link, and two physical links form a signal channel. Specifically, the first signal input positive electrode plate 131 and the first signal output positive electrode plate 231 are paired to form a capacitor CI(+) having a physical link PL(+) of the first signal, the first signal input negative electrode plate 132 and the first signal output negative electrode plate 232 are paired to form a capacitor CI(−) having a physical link PL(−) of the first signal, and the physical link PL(+) and the physical link PL(−) together form a signal channel of the first signal. Similarly, the second signal input positive electrode plate 133 and the second signal input negative electrode plate 134 are paired to form a capacitor having a physical link PL(+) of the second signal, the second signal input negative electrode plate 134 and the second signal output negative electrode plate 234 are paired to form a capacitor having a physical link PL(−) of the second signal, and the physical link PL(+) and the physical link PL(−) together form a signal channel of the second signal.

Reference is made to FIG. 3. FIG. 3 shows the block diagram of the signal transmission of a first set of signal (such as the first signal) in the capacitor coupling package structure P provided by the instant disclosure. As shown in FIG. 3, the first signal Din is input into the transmitter 3 (which is in a differential mode) in low data rate. The transmitter 3 processes the first signal Din to transfer the first signal Din into a differential signal, and modulates the transmission signal with flow data rate into a high frequency signal which can pass through the capacitors CI(+), CI(−). The modulated high frequency signal can generally have a frequency in a range of MHz to GHz. The high frequency signal can utilize the capacitor having smaller size for reducing the dimension of the capacitor coupling package structure P, for example, to have a capacitance of from 0.1 pF to 10 fF.

Next, the high frequency signals are respectively transmitted to the capacitors CI(+), CI(−) formed by the first signal input positive electrode plate 131 and the first signal output positive electrode plate 231, and to the receiver 4 in differential mode for forming the first signal Dout. In other words, the capacitors CI(+), CI(−) can establish physical links PL(+) and physical links PL(−) between the transmitter 3 and the receiver 4 for forming a signal channel.

In other words, in the embodiments of the instant disclosure, the first signal input positive electrode plate 131 and the first signal output positive electrode plate 231 are aligned with each other for forming a first positive physical link, and the first signal input negative electrode plate 132 and the first signal output negative electrode plate 232 are aligned with each other for forming a first negative physical link. The second signal input positive electrode plate 133 and the second signal output positive electrode plate 233 are aligned with each other for forming a second positive physical link, and the second signal input negative electrode plate 134 and the second signal output negative electrode plate 234 are aligned with each other for forming a second negative physical link. The first positive physical link and the first negative physical link are aligned with each other for forming a first signal channel, and the second positive physical link and the second negative physical link are aligned with each other for forming a second signal channel.

Figure 4:
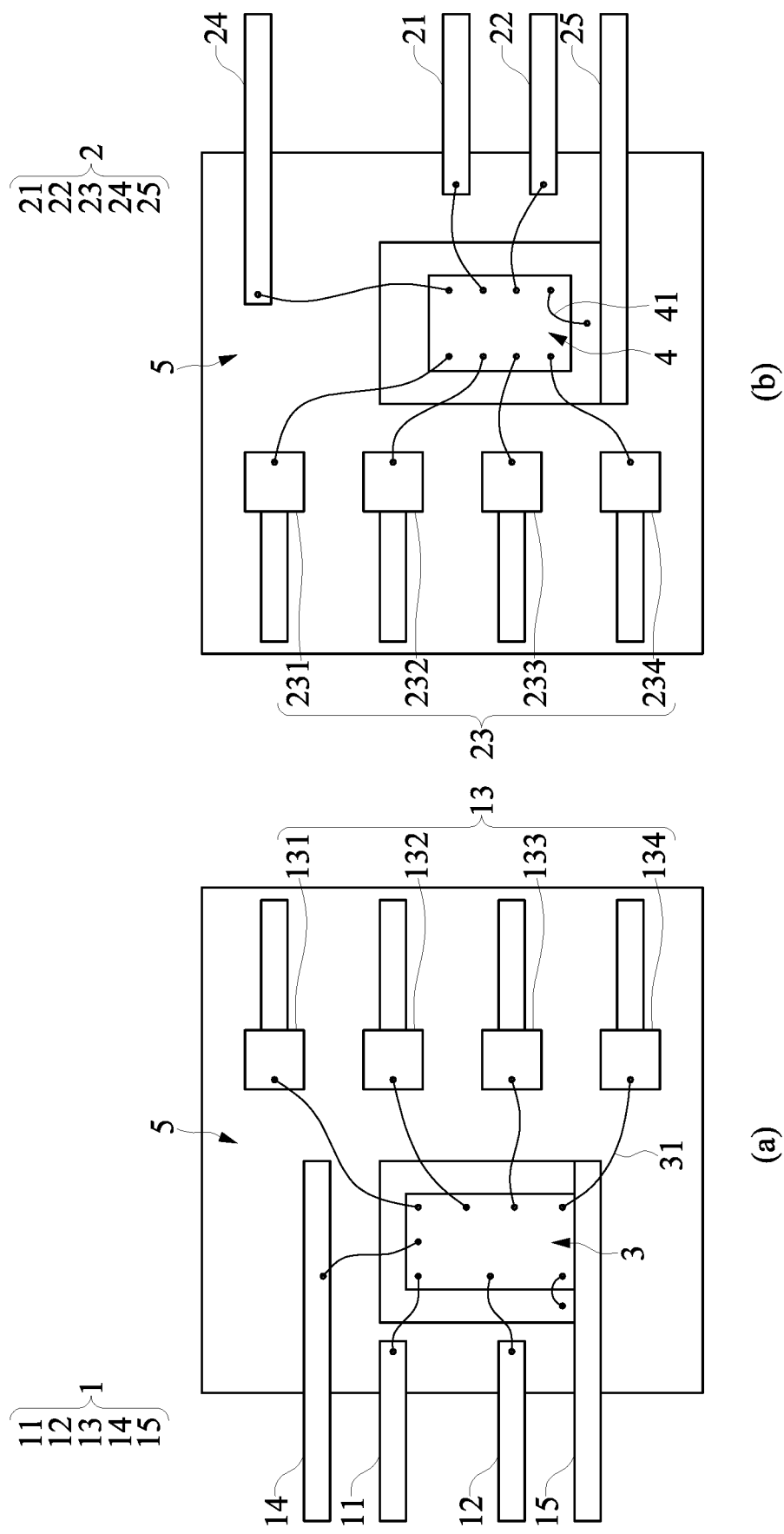
FIG. 4 is another schematic view of the capacitive coupling package structure provided by the instant disclosure.
Figure 5:
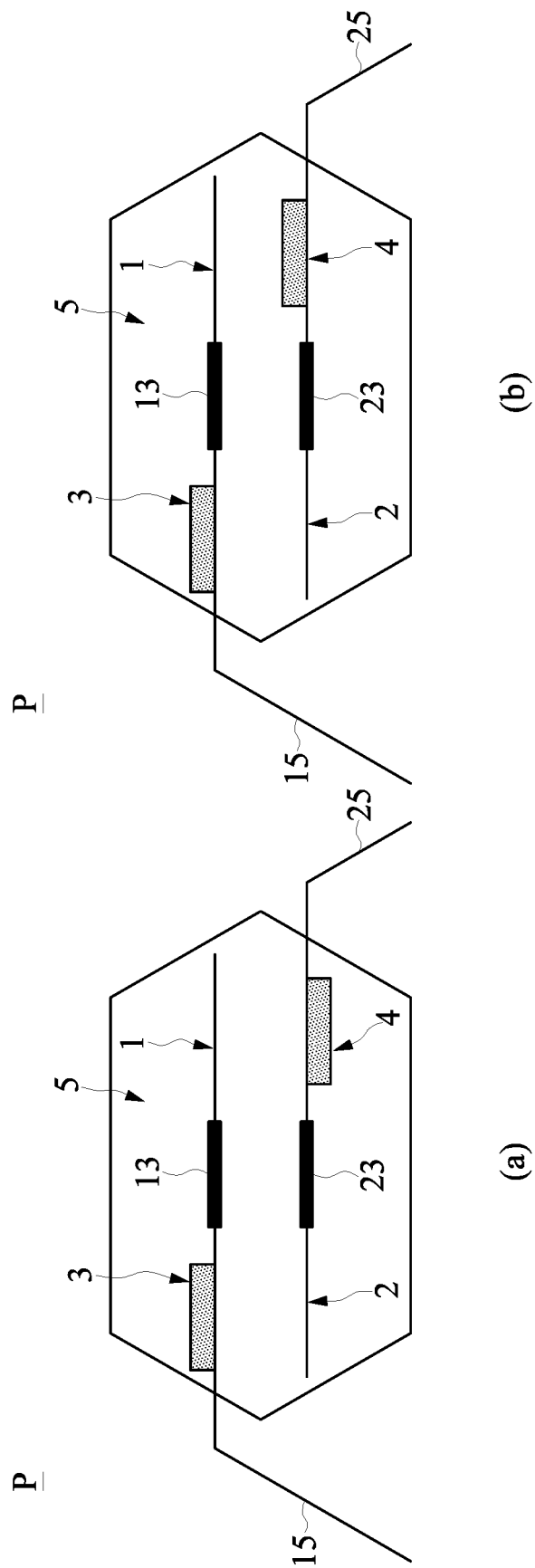
FIG. 5 is a partial schematic view of the capacitive coupling package structure shown in FIG. 4.

Reference is made to FIG. 4 and FIG. 5. FIG. 4 is another schematic view of the capacitive coupling package structure P provided by the instant disclosure, and FIG. 5 is a partial schematic view of the capacitive coupling package structure P shown in FIG. 4.

As described above in accordance to FIG. 2, in an embodiment of the instant disclosure, the first signal input pin 11, the second signal input pin 12 and the first electrode plate 13 of the first leadframe 1 are located on a same side of the transmitter 3, and the first signal output pin 21, the second signal output pin 22 and the second electrode plate 23 of the second leadframe 2 are located on a same side of the receiver 4. Such a structural design is shown in FIG. 1.

However, in another embodiment, the relative position of the components in the first leadframe 1 and the second leadframe 2 can be changed. For example, any two of the first signal input pin 11, the second signal input pin 12 and the first electrode plate 13 of the first leadframe 1 are located at different sides of the transmitter 3, and any two of the first signal output pin 21, the second signal output pin 22 and the second electrode plate 23 of the second leadframe 2 are located at different sides of the receiver 4. In other words, in the instant disclosure, as long as the first electrode plate 13 and the second electrode plate 23 in the capacitor coupling package structure P are corresponding to and aligned with each other for forming capacitors, the structural design of the first leadframe 1 and the second leadframe 2 can be changed.

For example, as shown in FIG. 5(a) and FIG. 5(b), the first signal input pin 11, the second signal input pin 12, the first direct current pin 14 and the first grounding pin 15, and the first electrode plate 13 of the first leadframe 1 are respectively disposed at two different sides of the transmitter 3, and the first signal output pin 21, the second signal output pin 22, the second direct current pin 24 and the second grounding pin 25, and the second electrode plate 23 of the second leadframe 2 are respectively disposed at two different sides of the receiver 4. Therefore, as shown in FIG. 4, in the capacitor coupling package structure P, the first electrode plate 13 and the second electrode plate 23 are arranged one above another and aligned with each other, and the transmitter 3 and the receiver 4 are dislocated with each other.

In the instant disclosure, the transmitter 3 and the receiver 4 are respectively disposed on the first leadframe 1 and the second leadframe 2. However, the transmitter 3 and the receiver 4 can be disposed on different surfaces of the first leadframe 1 and the second leadframe 2. Referring to FIGS. 5(a) and 5(b), in the FIG. 5(a), the transmitter 3 and the receiver 4 are respectively disposed on two opposite surfaces of the first leadframe 1 and the second leadframe 2. Therefore, the distance between the first leadframe 1 and the second leadframe 2 can be significantly reduced, thereby reducing the size of the capacitor coupling package structure P. Such a structural design can result in smaller capacitance of the in-package capacitors in the capacitor coupling package structure P.

In addition, the transmitter 3 and the receiver 4 can each be disposed on the two surfaces of the first leadframe 1 and the second leadframe 2 facing a same direction. For example, as shown in FIG. 5(b), the transmitter 3 is disposed on the upper surface of the first leadframe 1, and the receiver 4 is disposed on the upper surface of the second leadframe 2. In another embodiment of the instant disclosure, the transmitter 3 and the receiver 4 are respectively disposed on the surfaces of the first leadframe 1 and the second leadframe 2 which are facing each other. In other words, the arrangement of the transmitter 3 and the receiver 4 can be selected or adjusted based on the requirement of the product and the parameters in the manufacturing process.

Figure 6:
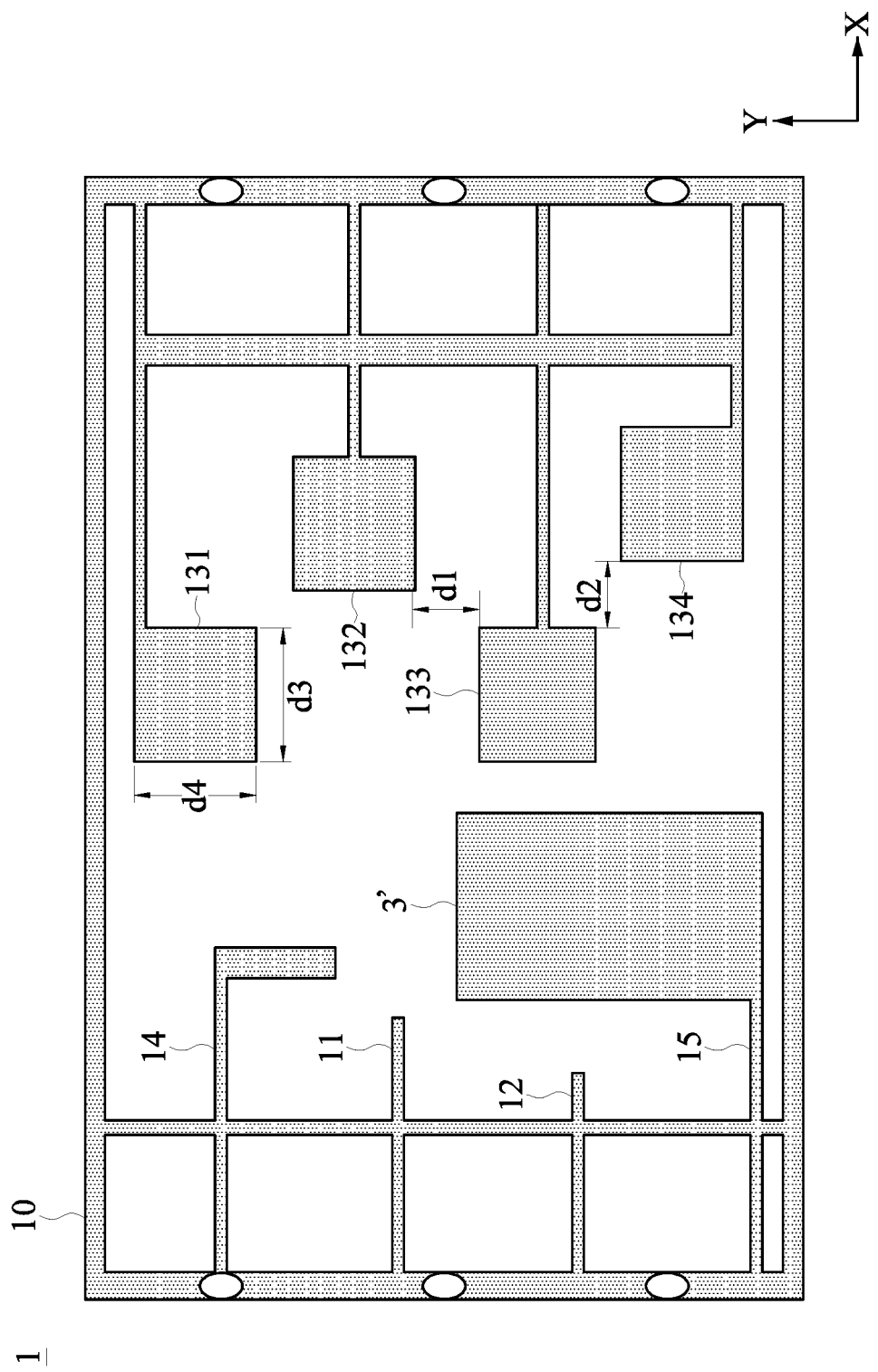
FIG. 6 is a structural schematic view of a first leadframe of the capacitive coupling package structure provided by the instant disclosure.

Reference is made to FIG. 6. FIG. 6 is a structural schematic view of a first leadframe of the capacitive coupling package structure provided by the instant disclosure. The structural designs of the first electrode plate 13 and the second electrode plate 23 in the first leadframe 1 and the second leadframe 2 are described in detail herein. Since the first electrode plate 13 and the second electrode plate 23 correspond to each other and have similar structures, only the structure of the first electrode plate 13 is described herein.

As shown in FIG. 6, the first leadframe 1 includes a leadframe body 10 and a first signal input pin 11, a second signal input pin 12, a first direct current pin 14, a first grounding pin 15 and a first electrode plate 13 before forming the capacitive coupling structure. The first leadframe 1 further includes a first carrying portion 3' for carrying the transmitter 3. After fixing the first leadframe 1 and the second leadframe 2 through the packaging body 5, the leadframe body 10 of the first leadframe 1 is removed.

The first electrode plate 13 includes a first signal input positive electrode plate 131, a first signal input negative electrode plate 132, a second signal input positive electrode plate 133 and a second signal input negative electrode plate 134 separated from each other. The electrode plates can have various shapes such as rectangular or square shapes. In addition, in order to minimize the crosstalk between different signal channels or physical links, the distance between the adjacent electrode plates can be controlled, or can be disposed in a dislocated manner.

In fact, the arrangement including the dislocation of the electrode plates (the first signal input positive electrode plate 131, the first signal input negative electrode plate 132, the second signal input positive electrode plate 133 and the second signal input negative electrode plate 134) not only minimizes the crosstalk but also reduces the volume of the capacitors while maintaining the capacitance of the capacitors. For example, in the instant disclosure, the distance between the adjacent electrode plates is at least 150 μm (such as the distance d1 in y axis shown in FIG. 6), and the adjacent electrode plates are dislocated with each other for rendering the closest edges of the two adjacent electrode plates have a distance of at least 150 μm therebetween (such as the distance d2 in x axis shown in FIG. 6).

In addition, in order to maintain the capacitance of AC coupling within a desired range, the area of the electrode plates can be controlled. For example, the area of an electrode plate can be at least 300 μm×300 μm. As shown in FIG. 6, the first signal input positive electrode plate 131 has a dimension d3, d4 of at least 300 μm in both x and y axis directions.

The capacitor coupling package structure P provided by the instant disclosure can be manufactured by a method using a single leadframe or by a method based on duo-leadframe. In other words, the first leadframe 1 and the second leadframe 2 can be formed individually from two separate leadframes and fixed by the packaging body 5, or the first leadframe 1 and the second leadframe 2 are belonging to a same leadframe which is trimmed and formed, and/or rotated for forming a structure in which the first leadframe 1 and the second leadframe 2 are arranged one above another and correspond to each other.

Figure 7:
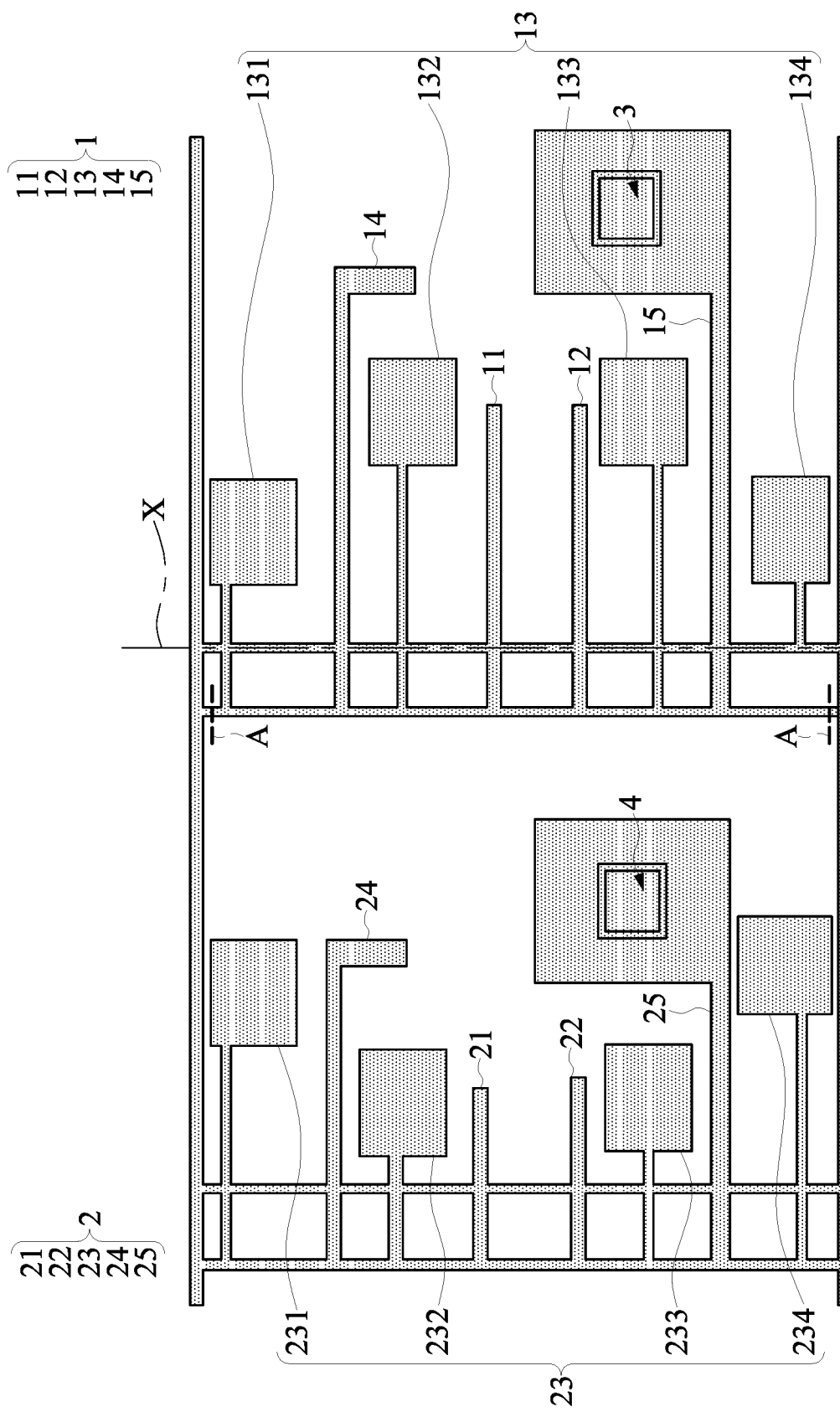
FIG. 7 is a structural schematic view of the first leadframe and a second leadframe of the capacitive coupling package structure provided by the instant disclosure.

The method based on two different leadframes (duo leadframe) to form the first leadframe 1 and the second leadframe 2 can be carried out based on the structure shown in FIG. 6. The method based on two single leadframes to form the first leadframe 1 and the second leadframe 2 can be carried out based on the structure shown in FIG. 7. FIG. 7 is a structural schematic view illustrating the first leadframe 1 and the second leadframe 2 of the capacitor coupling package structure P provided by the instant disclosure before being fixed by the packaging body 5.

As shown in FIG. 7, the first leadframe 1 and the second leadframe 2 are respectively formed at the right side and the left side of a single leadframe. FIG. 7 further illustrates the transmitter 3 disposed on the first leadframe 1 and the receiver 4 disposed on the second leadframe 2. However, for the sake of brevity, the first connecting wires 31 and the second connecting wires 41 are not illustrated in FIG. 7.

In the method for manufacturing the capacitive coupling structure provided by the instant disclosure, after respectively disposing the transmitter 3 and the receiver 4 on the first leadframe 1 and the second leadframe 2 and establishing electrical connections between the transmitter 3 and the receiver 4 and the connecting wires, the leadframe can be cut along the cutting line A near the center of the leadframe. Next, the first leadframe 1 on the right side can be rotated relative to the second leadframe 2 along the rotating axis X, thereby arranging the first leadframe 1 on the top of the second leadframe 2. In the instant disclosure, the locations of the first leadframe 1 and the second leadframe 2 in the leadframe can be adjusted, for example, the second leadframe 2 can be disposed on the right side of the leadframe or the left side of the leadframe.

It should be noted that after the first leadframe 1 is rotated and arranged directly above the second leadframe 2, the first electrode plate 13 of the first leadframe 1 is located directly above the second electrode plate 23 of the second leadframe 2, and the first electrode plate 13 and the second electrode plate 23 are aligned with each other for forming a capacitor. Next, the frame body of the leadframe can be deflashed (trim and form) and removed. The manner for removing the frame body is not limited in the instant disclosure. At last, the packaging body 5 is disposed between the first leadframe 1 and the second leadframe 2 for fixing the first leadframe 1 and the second leadframe 2, and a polyimide film is optionally disposed between the first leadframe 1 and the second leadframe 2 for providing required isolation voltage.

In the instant disclosure, when adopting a single leadframe for forming the capacitor coupling package structure P, the dimensions in the leadframe can be designed for allowing the distance between the first leadframe 1 and the second leadframe 2 after the rotating step to achieve the required isolation voltage. For example, before rotating the first leadframe 1, the pins in the first leadframe 1 can be bended for adjusting the distance between the first leadframe 1 and the second leadframe 2.

The process using a single leadframe for forming the capacitor coupling package structure P can achieve automatic alignment by rotating one of the leadframes based on the design of the dimensions of and the distances between the components in the leadframes. The first electrode plate 13 and the second electrode plate 23 are aligned with each other for setting the distance between the first leadframe 1 and the second leadframe 2.

Effect of the Embodiments

One of the advantages of the instant disclosure is that based on the technical features of "a package body 5 enclosing the first leadframe 1 and the second leadframe 2, the package body 5 being filled between the first leadframe 1 and the second leadframe 2 for electrically isolating the first leadframe 1 and the second leadframe 2 from each other" and "the first electrode plate 13 and the second electrode plate 23 are arranged one above each other and aligned with each other for forming a plurality of capacitors", the package structure P including capacitors can be manufactured by the leadframes under a simple process, and the isolating voltage of the product can be adjusted by the distance between the first leadframe 1 and the second leadframe 2 and the material of the packaging body 5.

Specifically, the capacitor coupling package structure P provided by the instant disclosure includes capacitors disposed in the semiconductor devices, i.e., on-package capacitors, and hence has smaller size and can be manufactured by a relative simple process, thereby significantly reducing the manufacturing cost. In addition, the capacitor coupling package structure P provided by the instant disclosure can be formed by a single leadframe or by a duo-leadframe. Therefore, the manufacturing process is flexible.

In addition, the capacitor coupling package structure P provided by the instant disclosure can achieve an isolation voltage more than 5 kV, even more than 12 kV and is suitable in the application related to semiconductor devices. The isolation voltage of the capacitor coupling package structure P can be changed by adjusting the distance between the first leadframe 1 and the second leadframe 2, the material of the packaging body 5 or other isolators disposed between the first leadframe 1 and the second leadframe 2.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A package structure for a capacitive coupling isolator, comprising:
   a first leadframe, including:
      a first signal input pin;
      a second signal input pin; and
      a first electrode plate including a first signal input positive electrode plate, a first signal input negative electrode plate, a second signal input positive electrode plate and a second signal input negative electrode plate separated from each other;
   a second leadframe corresponding to, aligning with and separated from the first leadframe, the second leadframe including:
      a first signal output pin;
      a second signal output pin; and
      a second electrode plate including a first signal output positive electrode plate, a first signal output negative electrode plate, a second signal output positive electrode plate and a second signal output negative electrode plate separated from each other;
   a transmitter disposed on the first leadframe and electrically connected to the first signal input pin, the second signal input pin and the first electrode plate;
   a receiver disposed on the second leadframe and electrically connected to the first signal output pin, the second signal output pin and the second electrode plate;
   a package body enclosing the first leadframe and the second leadframe, the package body being filled between the first leadframe and the second leadframe for electrically isolating the first leadframe and the second leadframe from each other;
   wherein the first electrode plate and the second electrode plate are arranged one above each other and aligned with each other for forming a plurality of capacitors.

2. The package structure according to claim 1, wherein the first leadframe further includes a first direct current pin and a first grounding pin both electrically connected to the transmitter, and the second leadframe further includes a second direct current pin and a second grounding pin electrically connected to the receiver.

3. The package structure according to claim 1, wherein the transmitter and the receiver are both operated in differential modes.

4. The package structure according to claim 1, wherein the first signal input pin, the second signal input pin and the first electrode plate are disposed on a same side of the transmitter, and the first signal output pin, the second signal output pin and the second electrode plate are disposed on a same side of the receiver.

5. The package structure according to claim 1, wherein any two of the first signal input pin, the second signal input pin and the first electrode plate are respectively disposed on two different sides of the transmitter, and any two of the first signal output pin, the second signal output pin and the second electrode plate are disposed on two different sides of the receiver.

6. The package structure according to claim 1, wherein a polyimide film is disposed between the first leadframe and the second leadframe, and the package body is filled between the first leadframe, the second leadframe and the polyimide film.

7. The package structure according to claim 1, wherein the first signal input positive electrode plate and the first signal output positive electrode plate are aligned with each other for forming a first positive physical link, and the first signal input negative electrode plate and the first signal output negative electrode plate are aligned with each other for forming a first negative physical link, wherein the second signal input positive electrode plate and the second signal output positive electrode plate are aligned with each other for forming a second positive physical link, and the second signal input negative electrode plate and the second signal output negative electrode plate are aligned with each other for forming a second negative physical link, the first positive physical link and the first negative physical link together forming a first communication channel, and the second positive physical link and the second negative physical link together forming a second communication channel.

8. The package structure according to claim 1, wherein the transmitter and the receiver are respectively disposed on two surfaces opposite to each other and each belonging to the first leadframe and the second leadframe.

9. The package structure according to claim 1, wherein the transmitter and the receiver are respectively disposed on two surfaces facing each other and each belonging to the first leadframe and the second leadframe.

10. The package structure according to claim 1, wherein the transmitter and the receiver are respectively disposed on two surfaces facing a same direction and each belonging to the first leadframe and the second leadframe.

* * * * *